United States Patent [19]

Soens

[11] Patent Number: 4,664,971
[45] Date of Patent: May 12, 1987

[54] PLASTIC ARTICLE CONTAINING ELECTRICALLY CONDUCTIVE FIBERS

[75] Inventor: Lode J. Soens, Kortrijk, Belgium

[73] Assignee: N.V. Bekaert S.A., Belgium

[21] Appl. No.: 643,759

[22] Filed: Aug. 24, 1984

Related U.S. Application Data

[63] Continuation of Ser. No. 373,611, Apr. 30, 1982, abandoned.

[30] Foreign Application Priority Data

Dec. 30, 1981 [NL] Netherlands .......................... 8105907

[51] Int. Cl.$^4$ ........................ B32B 15/08; C08K 7/04; H01B 1/22
[52] U.S. Cl. ............................... 428/288; 174/35 MS; 174/126 CP; 252/502; 252/510; 252/511; 252/512; 252/513; 264/104; 264/108; 264/143; 264/148; 264/174; 428/294; 428/372; 428/379; 428/457; 428/922
[58] Field of Search ............... 252/502, 510, 511, 512, 252/513; 428/288, 372, 379, 922, 294, 457; 264/104, 108, 143, 148, 174

[56] References Cited

U.S. PATENT DOCUMENTS

| | | | |
|---|---|---|---|
| 2,566,641 | 9/1951 | Camras | 428/379 |
| 2,877,501 | 3/1959 | Bradt | 428/372 |
| 3,288,175 | 11/1966 | Valko | 57/139 |
| 3,406,126 | 10/1968 | Litant | 252/511 |
| 3,712,776 | 1/1973 | Woodham | |
| 3,779,784 | 12/1973 | Emslie | 428/288 |
| 3,956,564 | 5/1976 | Hillig | 428/379 |
| 4,037,011 | 7/1977 | Hattori et al. | |
| 4,045,949 | 9/1977 | Paton et al. | 428/372 |
| 4,195,114 | 9/1978 | Crosby et al. | |
| 4,199,637 | 4/1980 | Sado | 428/379 |
| 4,209,481 | 6/1980 | Kashiro et al. | |
| 4,228,194 | 10/1980 | Meeder | 428/922 |
| 4,258,101 | 8/1978 | Hornbeck | |
| 4,332,853 | 9/1980 | Hornbeck et al. | |
| 4,370,396 | 1/1983 | Burk | 428/379 |
| 4,500,595 | 2/1985 | Gerteisen et al. | 428/294 |
| 4,530,779 | 7/1985 | Mayama et al. | 257/507 |

FOREIGN PATENT DOCUMENTS

| | | |
|---|---|---|
| 0032379 | 1/1981 | European Pat. Off. . |
| 59944 | 3/1976 | Japan . |
| 1268834 | 3/1972 | United Kingdom . |
| 2047253 | 4/1979 | United Kingdom . |

OTHER PUBLICATIONS

"An Experimental Investigation of Conductive Composites as EMI Shields", Group Research Program Report, Nov. 7, 1980, by Bigg et al, Batelle Columbus Laboratories, 505 King Ave., Columbus, Ohio 43201.

*Primary Examiner*—James C. Cannon
*Attorney, Agent, or Firm*—Cushman, Darby & Cushman

[57] ABSTRACT

The present invention relates to articles, particularly plate or sheet-like articles made of plastic in which very low contents of fine electrically conductive fibers are uniformly dispersed so as to make the articles conductive. It also relates to specific intermediate plastic products, referred to as grains, threads and granules, and the processes for manufacturing each of these products as well as the final conductive articles. The articles can be used as a suitable shielding against radio-frequency and high-frequency electromagnetic radiation or as antistatic plastic articles.

49 Claims, 5 Drawing Figures

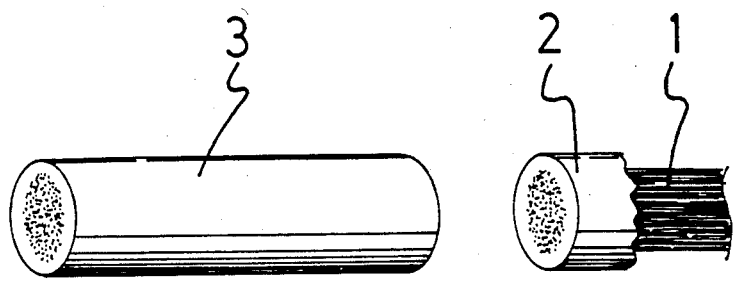
FIG. 1A    FIG. 1
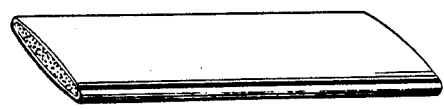
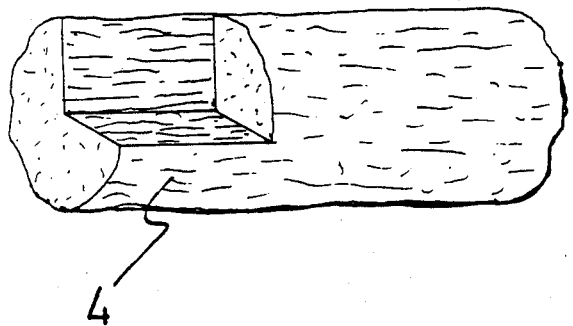
FIG. 2

PLASTIC ARTICLE CONTAINING ELECTRICALLY CONDUCTIVE FIBERS

This is a continuation of application Ser. No. 373,611, filed Apr. 30, 1982, and now abandoned.

BACKGROUND OF THE PRESENT INVENTION

The incorporation of electrically conductive fibers in plastics is well known, as, for example, for reinforcement purposes and/or for improving their electrical and/or thermal conductivity.

However, for some time authorities, as for example in the United States, have been showing concern for environmental hazards of various kinds of electromagnetic radiation, in particular those with high frequencies such as radar waves, microwaves and those produced by signals used in electronic circuits, e.g. in digital devices. The use of radio-frequency and high-frequency electromagnetic radiation will grow in the future as a consequence of the widespread application of microprocessors, digital calculators and weighing scales for cash registers, electronic typewriters, and other personal and business computers with associated peripherals, electronic toys and games, military equipment, etc.

When such devices are housed in metal boxes, they are sufficiently protected against emission of radio-frequency and high-frequency radiation by the metal itself which reflects the emitted radiation towards the box inside. Interference with and disturbance of radio, television or other electronic waves are thus avoided.

However, there is a trend to replace metallic boxes by plastic housings. So far, it has been customary to apply electrically conductive coatings in these plastic housings to provide a shield against the emission of electromagnetic radiation. But a drawback of such coatings is that they are not very durable. Moreover, in most cases, these coatings require special and expensive processing and application methods.

Attempts at imparting electrical conductivity to the plastics themselves (so that they shield against electromagnetic waves) have also been suggested by the incorporation and dispersion of relatively big quantities of conductive fillers. Such conductive fillers include carbon black, aluminum flakes, cut wire, metal coated glass fibers, wire meshes and carbon fibers. However, some drawbacks are associated with these conductive fillers. Some fillers do not permit sufficient dispersion in the plastic matrix and clog together or break excessively and degrade to very small particles so that their shielding effect is strongly reduced. This degradation makes it necessary to add a greater amount of conductive particles which renders a uniform dispersion even more difficult while having a negative impact on the mechanical properties of the material.

Finally, it is known that for effective shielding against electromagnetic radiation the conductive particles in the plastic matrix must possess a considerable aspect ratio, i.e. length-to-diameter (L/D) ratio; these particles must form as much as possible a continuous conductive network in the matrix in order to increase the conductivity without, however, substantially changing the physical and mechanical properties of the plastic matrix.

GENERAL DESCRIPTION OF THE INVENTION

It is an object of the present invention to make plastic articles with less than about 0.5% volume of fine electrically conductive fibers, which are substantially evenly distributed such that the distributed fibers provide suitable conductivity in the articles for use, for example, as EMI shielding. When the articles are in the shape of plates or sheets, the fibers can be evenly distributed throughout the body of the plate or otherwise just in certain predetermined areas thereof, e.g. next to one or both or part of its exterior or plane surfaces. The fine fibers have preferably an equivalent diameter of less than about 0.015 mm.

It is another object of the invention to provide means and measures to manufacture plate- or sheet-like plastic articles with a shielding effectiveness against electromagnetic radiation of at least about 25 dB within a wide frequency range (and in particular at 1 GHz) while maintaining their normal mechanical properties. Plate- and sheet-like articles are understood to comprise salts, various shaped profile cross-sections, foils, thin films, tubes, housings, bags, covers, or other containers.

For this purpose, electrically conductive fibers are dispersed in the plastic article having a length and an "equivalent" diameter ratio (D/L) which varies from about 0.0005 to about 0.008 for a major part of the fibers. These fibers may, for example, be metal fibers with an average length L between 0.5 mm and 5 mm and with an "equivalent" diameter D preferably larger than about 0.002 mm and smaller than about 0.015 mm. The term "equivalent" diameter D means the square root of the quotient of the surface of the fiber cross-section divided by $\pi$. The average length L means the total sum of the lengths of the incorporated fibers divided by the number of fibers. At an average length of L=0.5 mm, there will certainly be fibers with a length shorter than 0.5 mm. However, a major part of the fibers has a length approximating the average length. According to the invention these fibers dimension limits meet the abovementioned shielding requirements at an exceptionally low volume concentration C (%) of conductive fillers, namely between approximately 0.05 volume percent and about 0.5 volume percent. Moreover, when the plate or sheet thickness is smaller than 3 mm, then $C \geq 1.4D/L - 0.00082$, and for plate thicknesses between 3 mm and 6 mm $C \geq D/L - 0.0013$. These low concentrations exert almost no influence on the aspect of the plastic articles. I have further discovered that I can produce antistatic plastic articles by dispersing electrically conductive fibers in the plastic, at low concentrations (less than about 0.5% volume) and wherein the concentration C with respect to the fiber dimensions in said antistatic plastic may even meet the relationship $C < D/L - 0.0013$. The fibers should then be present at least next to the outer surface of the articles.

It is thus possible according to the invention to make plastic composite articles with such low conductive fiber content therein and to uniformly distribute said fibers in the plastic so that the article has a predetermined level of conductivity. The conductive fiber concentration can thereby vary between about 0.03% Vol. and about 0.5% Vol.

Furthermore, optimal D/L limits can be reached by adding the fibers during the industrial manufacture of plastic articles, within the abovementioned L, D and C limits. These D/L limits then also satisfy the following equation: $C \leq 3.34D/L - 0.00041$.

Since, in the matrix, the contact between the fibers must be as good as possible to stimulate the conductivity, it has appeared to be important that they possess a relatively smooth surface. This means that roughnesses on the fiber surface should project above or extend under the average level of the fiber surface less than about 1 μm. In this way it is statistically most likely that there will be an optimal number of contact surfaces between neighboring fibers, which contact surfaces moreover have optimal dimensions.

Stainless steel fibers, manufactured by a method of bundle drawing as described e.g. in the U.S. Pat. No. 2,050,298 or No. 3,379,000 showed particularly suitable intrinsic conductive properties for this application. Probably this is attributable to the fact that they are less prone to form a more or less insulating oxide layer on their surfaces in contrast with, for example, aluminium or copper fibers. This means that the contact resistance in the fiber contact points remains low. Usually, they are also more inert than Al or Cu towards most plastics. Other fibers such as Hastelloy-X, Inconel, Ti or Ni are usable as well. A suitable specific conductivity of the fibers is at least 0.5% of the copper standard.

In principle, the invention is applicable to most plastics, preferably thermoplastic types, under the application of the usual shaping techniques such as casting, extrusion, injection molding, press molding and foaming.

Accordingly, the articles may have a flexible, rigid or elastomeric nature. However, it is very easily applicable to thermoplastic resins and to their conventional shaping techniques such as extrusion and injection molding by using plastic pellets as a starting material. Therefore, in practice, it is recommended to add the conductive fibers in one way or another to the plastic pellets or to incorporate them into these pellets so that their compatibility with the plastics is not threatened and an optimally uniform dispersion of the conductive fibers in the plastics is reached during conventional shaping processes.

According to an important aspect of the invention, the uniform dispersion is obtained by using plastic grains as an intermediate product for the fabrication of the article whereby the grains are at least about 0.4 cm long and loaded with conductive fibers. The average length of the fibers in the grains will slightly exceed that of the fibers in the final article since during the molding process, a number of fibers always get broken. Further on, inventive measures are described to counteract this proneness to fiber breakage.

Moreover, the volume concentration of conductive fibers in the grains will always be greater than the required end concentration in the molded article. If, for example, it is desired to manufacture an article comprising 100 percent of the above described grains and with an end concentration of 0.3 percent by volume of metal fibers in the article, then the average volume concentration of metal fibers in the grains will be at least 0.33 percent. If, however, it is desired to make an article with the same end concentration of metal fibers (0.3 volume percent) on the basis of a mixture of 67 percent by volume of pure plastics pellets and 33 percent by volume of plastic grains loaded with metal fibers, then the average volume concentration of metal fibers in these grains will preferably be at least 0.99 percent.

In general, processes for making plastic articles having predetermined conductive portions therein according to the invention include the following steps. A fiber/plastics composite is provided having a conductive fiber content ranging from about 30% to 70% vol. and presenting a substantially parallel fiber arrangement therein. This composite is admixed with a predetermined amount of substantially pure plastic material and the blend is introduced in the hopper of for example an extrusion mixture. In such apparatus the material is heated to soften the plastic material and worked (kneaded) to evenly disperse the fibers in the plastic. Low shear forces are thereby applied to avoid excessive breakage of the fibers, however the shear forces must remain of a sufficient high level to evenly distribute the fibers within the plastic. To form the article, the so worked viscous mass can then be further forwarded by an extruder screw through suitable orifices, channels or slots to a mould or it can be directly and continuously extruded to rods, tubes, sheets, films or plates or injection molded.

When using a mixture of pure plastic pellets and composite grains which include fibers as described above, then cylindrical composite grains will be chosen with a diameter at least equal to the average thickness of the pure pellets. This measure usually reduces the proneness of the embedded conductive fibers to break during the hot mixing and kneading of the grain pellet mix preliminary to the actual molding. The length of the composite grain will, preferably, be between about 0.4 cm and about 1.2 cm.

For practical considerations, it is useful to provide plastic grains with standard dimensions and standard concentration and which can easily be mixed and processed with conventional plastic pellets in the desired proportion for obtaining a predetermined volume concentration of conductive fibers in the end product. Obviously, the main raw material of these grains will preferably be the same resin as that of the article to be formed. The cross-sectional surface of the composite grains will, moreover, at least be equal to that of the pure resin pellets. For example, a metal fiber volume percentage in the composite grains of 1 percent has proved to be suitable. The metal fiber content in the grains can be chosen between about 0.5% vol. and about 2% vol.

However, the composite grains may also contain plastic material different from that of the article to be made. The softening and melting point of the resin in the composite grains must, however, be lower than that of the plastic from which the article will be made to enable the composite grains, during the manufacture of the article, to spread easily and mix with the main raw material used for the article, at high temperatures, to thereby allow the conductive fibers to disperse therein under minimal shear forces.

The main raw material must also, for other reasons, be compatible with the resin of the composite grains. For example, this resin may not disintegrate or react with the main raw material when the latter is heated to its processing and molding temperature.

The most suitable basic product for the conductive fibers to be incorporated is a filament bundle, although other fiber bundles such as fiber slivers and staple fiber yarns are also applicable. The fiber slivers then shall possess a sufficient yarn number or tex (titre) and the fiber lengths shall be sufficiently long to form a properly coherent bundle with sufficient tensile strength for handling and processing. Average fiber lengths of 7 cm and approximately 2,000 fibers per sliver cross-section are suitable. Generally, the fiber bundles are embedded in a plastic matrix so that the fiber content therein is between 30 volume percent and 70 volume percent. The impregnated fiber bundle is allowed to stiffen (e.g. by cooling) in order to produce a so-called thread having a cross-sectional surface, preferably not smaller than and about equal to the cross-sectional size of the plastic pellets of the main raw material.

The thread may be round or have a variety of other cross-section shapes, e.g. oval, flattened, or rectangular, to facilitate winding up and chopping into particles. The thread may comprise 35,000 adjacent filaments (or fibers), but a lower number (over 1,000 filaments) is recommendable.

It is often recommended to envelop the impregnated bundle with a sheath made of either the same plastic as the main raw material, or the same or another plastic as that with which the bundle was impregnated. This stimulates the gradual disintegration of the cut bundle and the uniform dispersion of the fibers in the plastic matrix while mixing at high temperatures. The thread is chopped into predetermined lengths, referred herein after as granules, with such lengths ranging from at least about 0.4 cm and at most about 1.5 cm.

It is evident that the plastic material with which the fiber bundle was impregnated and sheathed must be compatible with the main raw material of the article to be formed. For example, where this raw material is a thermoplastic material the impregnating resin is preferably a relatively low molecular weight thermoplastic polymer such as a polyethylene, polypropylene, polyester, polyacrylate, polymethacrylate, polystyrene, P.V.C. and P.V.C. copolymers.

The thermoplastic grains with the conductive fibers dispersed therein are prepared by making a dry mix of pure plastic pellets (the main raw material) and a number of granules in which an appropriate quantity of parallel fibers are embedded, which fibers possess approximately or predominantly the same lengths as the granules. This mix is subsequently kneaded in an extrusion mixer under elevated temperature and under the application of low shear forces in order to disperse the conductive fibers in the plastic material. Thereafter, the soft mass is extruded into one or more threads with suitable cross-sections and cooled down. Finally, the threads are transversally chopped into grains with lengths of at least about 0.4 cm.

BRIEF DESCRIPTION OF THE DRAWINGS

The invention will now be further described by means of a few embodiments and with reference to the accompany drawings, in which:

FIG. 1 is a partial perspective view of the formative and finished stages of a thread formed from an impregnated and sheathed bundle of conductive fibers and a granule cut from this thread;

FIG. 1A is a partial perspective view of a thread as in FIG. 1 but having a flattened cross-section;

FIG. 2 is a drawing of a plastic grain containing dispersed conductive fibers;

DETAILED DESCRIPTION OF THE PRESENT INVENTION

EXAMPLE 1

Figure 3:
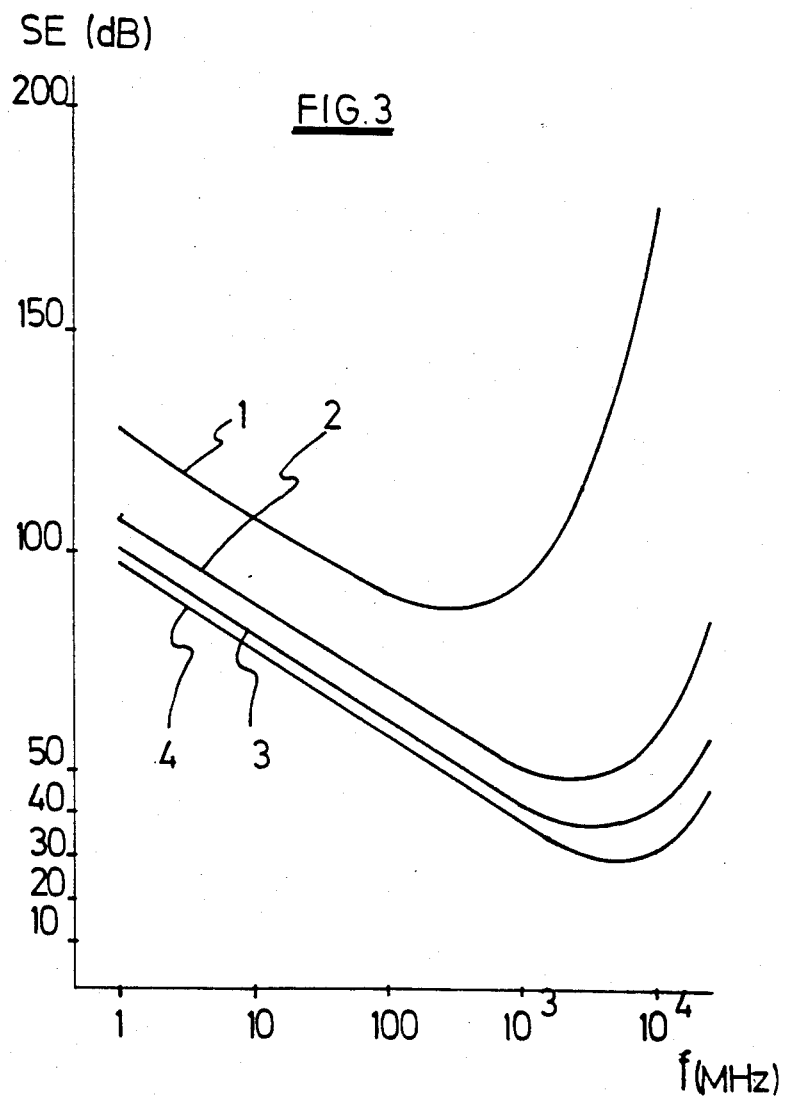
FIG. 3 is a graphic representation of the relationship between the wave frequency (f) of electromagnetic radiation and the shielding effectiveness (SE) of a 3 mm-thick plastic plate containing conductive fillers.

With reference first to FIG. 1, a substantially round, not twisted, bundle 1 of 20,400 stainless steel filaments, AISI 316L of the type BEKINOX ® (trademark of applicant) with an equivalent filament diameter of 0.008 mm, was passed through a solution of 20% by weight of a relatively low molecular weight linear polyester (M.W. circa 14,000) of the type Dynapol L850 (Dynamit Nobel) in trichloroethylene. After leaving the bath, the bundle was pulled through a round stripping orifice, with a diameter of 1.8 mm, and dried. The dried bundle thus comprised 6.2 percent by weight of resin (which equals 70 percent by volume of metal fibers). Such impregnated bundle was enveloped in a wire sheath extruder (type Maillefer with fixed centering) with the same polyester Dynapol L850. The round extrusion nozzle had a diameter of 2 mm. After the thus extruded thread 2 had cooled down, it was chopped into cylindrical granules 3 with a length of 1 cm. The granules comprised approximately 13 percent by weight of resin which equals approximately 52 percent by volume of metal fibers. When cutting the bundle almost no metal fiber ends were pulled out of it and hook formation and flattening of the fiber ends were avoided. This was important to assure a reliable dosage and fluent dispersion. Then the granules were dry mixed by tumble blending techniques with the usual thermoplastic pellets of various kinds of resins in the proportion of 9.75 percent by weight of granules to 90.25 percent pure plastic pellets and extruded into a substantially round thread with a diameter of 4 mm and a metal fiber content of approximately 8 weight percent. After cooling, this extruded thread was cut again into grains 4 (FIG. 2) with a length of 1 cm. In these grains, the metal fibers appeared to be evenly dispersed with a volume content of about 1.1 percent. The shear forces encountered during extrusion were held sufficiently low so that excessive fiber breakage was avoided. One of the measures applied to keep the shear forces down to a minimal level involved the removal of the filter plates at the inlet of the cross head nozzle. The temperature at the nozzle of the single-screw extruder was 260 degrees centigrade when NORYL-SE90 (a modified polyphenyleneoxide of General Electric) was used. When using Cycolac AM1000AS (an ABS resin of Borg Warner) the extrusion temperature at the cross head nozzle was 220 degrees centigrade. When using Lexan L13848-141R-111 (a polycarbonate of General Electric) it was 225 degrees centigrade. The extruder was of the type Samafor 45 with a length-to-diameter ratio of the screw equal to 25. The feeding channel in the cross head next to the extrusion orifice was a ring like space between a tapering outer surface of a mandrel and the concentrically arranged conical inner surface of the nozzle head. The channel was thereby confining towards the extrusion orifice and shear was thereby somewhat increased and this resulted in a better fiber dispersion whereby the fibers were oriented in a preferred orientation in the extrusion direction. Similarly, the extruder screw had a tapered end extending in a concentrically arranged conical ring space. The walls defining this space again converged towards the outlet opening in the feeding channel of the cross head nozzle. In so doing a certain preorientation of the fibers in the viscous plastic was obtained on its entry in the ring-shaped feeding channel of the nozzle.

The thus obtained composite grains were dry mixed with an equal weight quantity of pure plastic pellets and fed to an injection molding machine of the Ankerwerk V24/20 type with a screw to which a mold was connected for molding plaques with a thickness of 2.3 mm, a length of 30 cm, and a width of 25 cm. The temperatures in the screw chamber were respectively 250 degrees centigrade, 210 degrees centigrade and 290 degrees centigrade, respectively for the Noryl, Cycolac, and Lexan resins, and the temperature of the molds was set at respectively 80 degrees centigrade, 50 degrees centigrade and 90 degrees centigrade. The screw rotated at 44 revolutions per minute. The nozzle opening had a diameter of approximately 1 cm. The Noryl-, Cycolac- and Lexan-plates had smooth surfaces and the fiber dispersion or distribution throughout the plates was even. The concentration of metal fibers amounted to 4 weight percent or 0.5 volume percent. The Bekinox ® stainless steel fibers were evenly dispersed in the plastic matrix. They have a specific conductivity of about 2% of the copper standard.

EXAMPLE 2

Under similar conditions as in Example 1, injection molded plates were made of the thermoplastic resins mentioned above. However, a flat bundle of 20,400 adjacent Bekinox ® filaments with a diameter of 0.008 mm was used as is shown in FIG. 1A. As in Example 1, the flat bundle was again impregnated with a Dynapol L850 solution and stripped through a rectangular 5 mm×0.5 mm orifice. The dried bundle comprised 6.4 percent by weight of resin and was enveloped with the same polyester resin in a slot extruder at 280 degrees centigrade. The dimensions of the rectangular extrusion nozzle were 5 mm×0.6 mm and the obtained cooled strand comprised 23 percent by weight of resin which equals approximately 32 percent by volume of metal fiber. The flat thread was chopped in 1 cm lengths whereby hook formation and flattening of the fiber ends were absolutely avoided. Clamping of the fibers in a flat bundle in the resin matrix for the sake of accurately cutting the granules proved to be very effective. The obtained flat granules were then, without any difficulty, dry mixed with pure plastic pellets in a ratio between 10.66 and 89.33 weight percent and extruded into a substantially round thread with a diameter of 4 mm (see Example 1). The metal fiber content amounted to approximately 8 weight percent which corresponds to approximately 1.1 volume percent. Composite grains with a length of 1 cm were cut from this thread. After dry mixing these composite grains with an equal weight of pure plastic pellets and injection molding of the mixture as described above, an even dispersion was observed. The average fiber length was estimated at approximately 1.5 mm and the end concentration again amounted to 0.5 volume percent. See area A in FIG. 4.

The shielding behavior against electromagnetic radiation of the injection molded plates was tested. As known, the shielding behavior of a plastic material loaded with conductive filler can be determined in proportion to the plate thickness by comparing the reflection R (%) measured at one radiation frequency (e.g. 10 GHz) with the reflection (100%) on a reference material such as a metal plate. If the electrical properties of the material are sufficiently homogeneous and the conductive filler in the plastic forms a network with a sufficiently small mesh size (e.g. of an order of magnitude smaller than the wave length of the radiation to be shielded), then the shielding behavior can be extrapolated for the full frequency range. Moreover, it is known that for a great number of application for electrically conductive plastics, the shielding requirements are met when a shielding effectiveness (SE) of 25 dB is obtained at a frequency of 1 GHz. It was also found that the SE value for electric fields and for materials with a specific resistance between 0.01 Ωcm and 100 Ωcm always is minimal in the vicinity of 0.4 to 5 GHZ for plate thicknesses between 1 and 6 mm and with a distance of approximately 1 cm to 10 cm between the wave source and the plastic plate. A relationship between the shielding effectiveness SE and the wave frequency f is shown in FIG. 3 for a plate thickness of 3 mm and a distance between the source and the plate of 1 cm. Curve 1 refers to the relationship for reflection values R=99%, measured at 10 GHz, whereas curve 2 shows the relationship for R=70%, always at 10 GHz. If, for example, for a conductive plastic plate with a thickness of 3 mm, a reflection R is measured of 80% at 10 GHz (source-to-plate distance is 1 cm), then it can be derived from FIG. 3 that the SE value will be at least 35 dB at any frequency. When R=70% and 1 GHz, then SE=38 dB.

Analogously, the following values hold for other plate thicknesses and measured at a distance of 1 cm between source and plate:

| Thickness (mm) | 10 GHz | | 1 GHz | |
| --- | --- | --- | --- | --- |
| | R (%) | SE (dB) | R (%) | SE (dB) |
| 4 | 70 | 35 | 70 | 41 |
| 2 | 85 | 35 | 70 | 34 |
| 1 | 95 | 35 | 70 | 27 |

From the shielding theory (Schultz) it can further be derived that the specific resistance ρ (Ωcm), for homogeneously conductive plastic plates and independently of the plate thickness, shows the following values corresponding with the following reflection values (R — %). See table:

| R (%) | ρ(Ω cm) |
| --- | --- |
| 99 | 0.11 |
| 95 | 0.53 |
| 90 | 1.1 |
| 80 | 2.2 |
| 70 | 3.3 |

Hence, it can be derived from the data that a thicker plate may possess a lower specific conductivity (1/ρ) and a lower reflection value to reach the same shielding effectiveness (SE) at a given frequency (e.g. at 1 GHz). Thus, the D/L value of the fibers may at a same fiber concentration be higher in a thicker plate than in a thinner plate, or, in other words, the fiber concentration in a thicker plate may be smaller than in a thinner plate when D/L is equal in both plates.

Transmission, reflection and resistivity measurements were conducted on the injection-molded plates or sheets. The transmission and reflection measurements were made at 10 GHz. For these measurements the plates were placed between a wave emitter (an oscillator) to which, via a circulator, a first horn antenna was connected and a second horn antenna which is connected to a second detector. The energy generated by the oscillator is sent to the plate via the first antenna and the transmitted energy is, via the second antenna, registered by the second detector connected thereto. The reflected energy is returned to the first antenna and registered by a first detector connected thereto. This amount of reflected energy is expressed in percent (R-value) of the amount of energy (100%) which is reflected by a metal plate in the same circumstances. When the amount of transmitted energy is equal to zero, then, for the purpose of reflection measurement and registration, the plate is reciprocated at constant speed between and from near the first antenna to the second antenna over a distance of 22 cm. This movement starts at least 14.5 cm away from the circulator. This dynamic method enables the avoidance of measuring errors which might occur in static measurements when the position of the various plates relative to the circulator is not exactly the same during the successive measurements. Indeed, the measured reflection signal is always the result of successive reflections and rereflections between the plate specimen and the metal (circulator, antenna). This produces a standing wave pattern as a function of the distance between specimen and emitter. In the dynamic method, the average value of the registered standing wave pattern is determined by a microprocessor.

For the measurement of the specific resistance (resistivity), the plates or sheets are connected near their opposite edges between clamps in an electric circuit. To obtain good conductive contact between these clamps and the conductive fibers in the clamped plate edges, the latter are scoured and coated with silver paint.

The measuring results were as follows (average values):

|  | Reflection (%) | Transmission (%) | Specific resistance ($\Omega$ cm) |
| --- | --- | --- | --- |
| Noryl | 65 | 0 | 2 |
| Lexan | 71 | 0 | 3 |
| Cycolac | 65.5 | 0 | 4 |

This shows that the injection-molded plates with a thickness of 2.3 mm were on the limit between insufficient and sufficient shielding effectiveness (35 dB) for certain applications. See area A in FIG. 4.

EXAMPLE 3

A similar resin-impregnated flat filament bundle (thread) as in Example 2 was chopped into granules of 1 cm length and as in Example 2 mixed with pure resin pellets (*Cycolac*) in the desired proportion. These resin pellets had the usual dimensions (approximately 0.5 cm long, 0.5 cm wide, and 0.2 cm thick). The mixture was extruded into a round thread and cut to form composite grains containing approximately 1.1 percent by volume of metal fibers (see Example 2). The composite grains were then dry mixed with pure plastic pellets in a 50/50 proportion and were fed to an injection molding machine of the Maurer type with a nozzle orifice having a diameter of 0.95 cm. The same temperatures as in Example 2 were applied. If also the shielding characteristics must be sufficient in the immediate vicinity of the nozzle, the injection will preferably take place at a slow pace and/or an after-pressure will be applied at the end of the injection process, which is kept as low as possible. The injection molded plates were 5 mm thick. The average fiber length L was determined by cutting very thin slices from these plates, and subsequently dissolving the resin from these slices and analysing the remaining fiber netting under a microscope. Area B in FIG. 4 corresponds with the thus determined fiber length distribution. The shielding and conductivity measurements were conducted as described above. The results are summarized in the table below:

|  | Reflection (%) | Transmission (%) | Specific resistance ($\Omega$ cm) |
| --- | --- | --- | --- |
| Cycolac | 68 | 0 | 4 |

EXAMPLE 4

Figure 4:
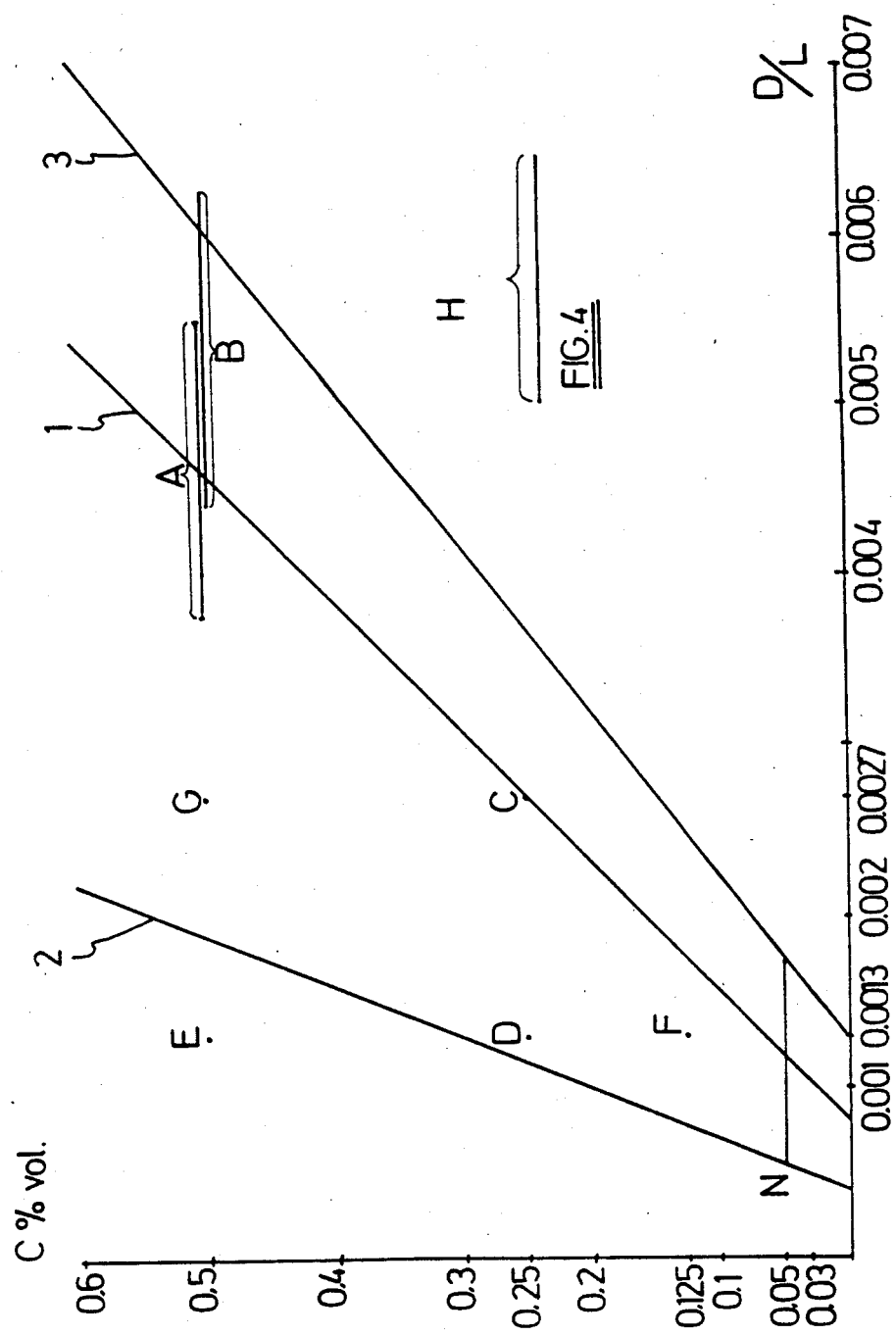
FIG. 4 is a graphic representation of the optimal field of operation for the invention in terms of fibers concentrations and D/L ratios.

Flat granules comprising 20,400 parallel stainless steel fibers with a diameter of 8 $\mu$m and a length of 3 mm embedded in 8 percent by weight of acrylate resin K70 (from the company Kontakt Chemie) were, under careful stirring, directly added to a 45% solution of a thermo-hardening polyester resin Derakene 411 in styrene. The fibers from the granules were evenly dispersed in the resin and the usual accelerators were added, as well as a catalyzer. The relatively liquid mass was molded into 30 cm$\times$30 cm$\times$3 mm plates and de-aerated. The mold was closed and rotated during the cold hardening process to prevent the metal fibers from settling to the bottom of the mold. The hardened plate comprised 0.5 percent by volume of metal fibers. In FIG. 4 this mix composition corresponds with point G. The measured reflection amounted to 92% at a specific resistance of 0.43 $\Omega$ cm and at a transmission of 0%.

Similar plates (same dimensions) were made with compositions as mentioned hereunder. Reflection, transmission and specific resistance were measured.

| D (mm) | L (mm) | C (%) | R (%) | specif. resist. ($\Omega$ cm) | transmission (%) | point in FIG. 4 |
| --- | --- | --- | --- | --- | --- | --- |
| 0.008 | 3 | 0.25 | 70 | 1.44 | 0 | C |
| 0.004 | 3 | 0.25 | 87 | 1.68 | 0 | D |
| 0.004 | 3 | 0.50 | 84 | 3.11 | 0 | E |
| 0.004 | 3 | 0.12 | 70 | 15.1 | 0 | F |

From the examples and results limits were derived for the volume concentration of the fibers (C%) as a function of the D/L ratio of the fibers. The straight line 1 in FIG. 4 corresponds to C=1.4 D/L−0.00082 whereas the straight line 2 represents the equation C=3.34 D/L−0.00041. According to the invention, the area between the two straight lines 1 and 2 determines the optimal conditions for C, D and L to provide sufficient shielding effectiveness for plates with a thickness smaller than 3 mm. For plate- or sheet-like articles with a thickness between 3 mm and 6 mm, the straight line 3 in FIG. 4 will be the lower limit for providing sufficient shielding. This straight line corresponds with the equation C=D/L−0.0013.

EXAMPLE 5

A substantially round, non-twisted bundle of about 10,000 Bekinox ® stainless steel filaments AISI 316L with an equivalent filament diameter of 0.004 mm can be impregnated and sheathed, for example, with a Dynapol L850 solution as explained in Example 1 to form a strand. Granules of 0.5 cm in length were cut from this strand and dry blended in the appropriate proportion with CYCOLAC-KJB-pellets to make grains. The grains were again made by extrusion on the Samafor 45 extruder (Example 1) and comprised about 0.5% volume of the fibers. Their length was chosen at 1 cm. After dry blending again these grains with an equal amount in weight of Cycolac KJB pellets, the mixture was fed to the injection molding machine used in Example 1 to mold a plate of 2.3 mm thick. An even dispersion of about 0.23% volume of fibers was realized in the plate and the average fiber length was estimated at about 0.7 mm. This result is indicated by line H in FIG. 4. The antistatic performance of this plate was estimated by rubbing the plate with a textile pad so as to generate an electrical charge on its surface. The plate was then brought in the vicinity of a certain quantity of fine cigarette ash dust laying on a table. There was no significant tendency for the paper dust to lift from the table and to deposit itself on the underside of the plate. However, when repeating the same antistatic dust test with a pure CYCOLAC-KJB-resin plate, devoid of metal fibers, the paper dust was immediately attracted to the plate.

To manufacture articles of thermoplastic foam material in molds, one may use, as described here-above, a predetermined mix of pure plastic pellets containing an appropriate amount of blowing agent. It is also possible to mix the blowing agent in powder form with pure plastic pellets and with a suitable amount of composite grains.

For example, the pellets can be moistened so that the powder sticking to them can spread sufficiently evenly over them. Afterwards, the mixture can be fed to the injection molding machine in the usual manner.

It is also possible to distribute the conductive fibers in a thermoplastic resin by mixing a low percentage of loose fibers with a length of less than about 1 cm together with the plastic powder and feeding the mixture in a usual way to the extrusion or injection molding machines. It is further feasible to continuously introduce a number of fine and untreated metal fiber slivers at a predetermined velocity together with the plastic powder or pellets in the feeding hopper of the extrusion or injection molding machine. Each sliver may comprise at least about 100 fibers per cross-section and the average metal fiber length in the sliver may be as high as 20 cm although it will preferably be lower. An even distribution of the fibers in the plastic in a very low concentration can then be achieved by adjusting the shear forces in the plasticised material.

For the preparation of thermoplastic elastomer articles (e.g. comprising an elastomeric polyester Hytrel), elastomer pellets can be used mixed with a suitable proportion of composite grains prepared on the basis of the same elastomer. However, the shear forces must be particularly low during the kneading and molding processes.

For sheet molding, pre-impregnated fiber sheets (pre-pegs) it is possible to disperse the conductive fibers preliminarily in the liquid resin in an appropriate concentration. For bulk molding viscous mixtures of resin and fibers, the conductive fibers can be dispersed in the mass in a similar way.

In particular, it is possible to mix the conductive fibers preliminarily with other fibers, e.g. reinforcing fibers such as glass fibers, carbon fibers, polyaramid fibers, and to disperse this fiber mix in some way in the resin. For processing into thermoplastic resins, it is possible to replace the aforedescribed thread of conductive fibers embedded in plastics by a thread comprising a mixture of glass fibers and conductive fibers in the desired proportion. It is also possible to impregnate glass fiber bundles in a side-to-side disposition with bundles of conductive fibers to form the thread. Finally, it may be preferred to mix threads comprising reinforcement fibers and cut into granules with threads comprising conductive fibers and cut into granules in an appropriated pellet weight proportion and to feed them to the molding machine, while adding, if so desired, a suitable quantity of pure plastic pellets (main raw material).

Certain other additives in the plastic may favor also the shielding properties either by improving the electrical conductivity of the plastic due to its proper electrical properties or by facilitating the dispersion of the conductive fibers during processing or by both. Some flame retardant agents added during compounding of the raw plastic material have improved the shielding behavior in combination with the incorporation of stainless steel fibers in plastics as described above.

The invention has particularly been described in the light of its application of shielding against radio frequency and high frequency waves. In case of a considerable L/D ratio of the thin conductive fibers in the plastic matrix, electromagnetic waves in the radar frequency range can be greatly absorbed. The volume concentration of fibers may in this case be very low since good conductivity is no requirement for camouflage against radar waves. Here, the surface resistivity of the plastic plates containing dispersed conductive fibers will preferably be higher than 100 $\Omega$/sq. A reflection value of 10% is sufficient, but generally it will be approximately 40–50%. The relationship between fiber concentration and D/L will in most cases correspond to a point in the area to the left of the straight line 2 in FIG. 4 at concentrations lower than 0.25 volume percent.

Stainless steel fibers were used in the examples. Other electrically conductive fibers are, in principle, also applicable, e.g., glass fibers with a metal coating or carbon fibers in so far as the dispersion process in the plastic matrix can take place under sufficiently low shear forces in order to counteract the proneness or tendency of the fibers to break. Possibly, it will be also be necessary to adapt the injection molding conditions: rheology of the plastics during injection molding and injection speed. The diameter of the extrusion orifice will at least be twice the thickness of the plate to be molded.

Besides the polymers described in the examples numerous other resins can be used in producing the finished product which incorporates conductive fibers. These include but are not limited to polycarbonates, polyacetates, polyarylates, polyvinylchoride, fluoro polymers such as polyvinylidenefluoride etc.

While the invention has been described in connection with what is presently considered to be the most practical and preferred embodiments, it is to be understood that the invention is not to be limited to the disclosed embodiments but on the contrary, is intended to cover various modifications and equivalent arrangements included within the spirit and scope of the appended claims, which scope is to be accorded the broadest interpretation so as to encompass all such modifications and equivalent structures.

What I claim is:

1. A plastic article in the form of a plate or sheet, which is electrically conductive at least in certain predetermined parts, comprising a plastic material including electrically conductive fibers said fibers having a specific conductivity of at least 0.5% of the copper standard which are substantially evenly distributed in said parts, said fibers having a length L and an equivalent diameter D varying between about 0.002 mm and about 0.015 mm so that the ratio D/L varies from about 0.0005 to about 0.008 for a major part of said fibers and wherein the volume concentration (C%) of said fibers in said parts varies between about 0.05% and about 0.5% so that the specific resistance of the article is less than about 3.1 ohm-cm, wherein said plastic material is a thermoplastic resin and said article is formed by injection moulding.

2. An article according to claim 1 wherein when the thickness of said plate or sheet is less than about 3 mm, the volume concentration C of conductive fibers in the plate or sheet meets the relationship $C \geq 1.4 \, D/L - 0.00082$ and when the thickness of said plate or sheet is between about 3 mm and about 6 mm the volume concentration (C) meets the relationship $C \geq D/L - 0.0013$.

3. An article according to claim 2, whereby $C \geq 3.34 \, D/L - 0.00041$.

4. An article according to claim 1, wherein the conductive fibers have relatively smooth surfaces.

5. An article according to claim 1 or 4, wherein the conductive fibers are stainless steel fibers.

6. An article according to claim 1, wherein the plastic is a thermosetting resin.

7. An article according to claim 6, wherein it is a foamed resin.

8. An article according to claim 6, wherein the plastic is an elastomer.

9. An article according to claim 7 wherein the plastic is an elastomer.

10. An article according to claim 1, wherein it comprises still other fibers.

11. An article according to claim 10, wherein at least part of the other fibers are reinforcing fibers.

12. A plastic grain having a length between about 0.4 cm and 1.2 cm including a pure plastic and a low molecular weight plastic material and electrically conductive fibers which have been subjected to shear forces so that they are dispersed therein, whereby the conductive fiber content therein has a concentration of said conductive fibers that ranges from about 0.5% to about 2.0%.

13. A plastic grain according to claim 12 whereby they further include other fibers.

14. A thread comprising a bundle of between 1000 and 35000 adjacent conductive fibers embedded in plastic, wherein the fiber content therein is between about 30 volume percent and about 70 volume percent, the fiber conductivity is at least 0.5% of the copper standard, the fiber diameter is a most 0.015 mm and the plastic includes a thermoplastic polymer of relatively low molecular weight.

15. A thread as in claim 14 further including an outer sheath comprised of an additional plastic material.

16. A plastic composite article in the form of a plate or sheet comprised of a plastic material in which the volume concentration (C%) of electrically conductive fibers varies from about 0.03 to about 0.5%, said conductive fibers have an effective diameter (D) ranging from about 0.002 mm to about 0.015 mm and an average length (L) varying from about 0.5 mm to about 5.0 mm with a resulting D/L ratio ranging from about 0.0005 to about 0.008 for a major part of the fibers and which are substantially uniformly distributed throughout the composite article so that the article has a predetermined level of conductivity so that the resistance of the composite article is less than about 3.1 ohm-cm wherein the conductive fibers have a specific conductivity of at least 0.5% of the copper standard.

17. A plastic composite as in claim 16 wherein the thickness of the plate or sheet is less than 3 mm and $C \geq 1.4 \, D/L - 0.12$.

18. A plastic composite as in claim 16 wherein the thickness of the plate or sheet varies from 3 mm to about 6 mm and $C \geq D/L - 0.18$.

19. A plastic plate or sheet formed from a plastic material having a predetermined portions through which conductive fibers are substantially uniformly distributed, said conductive fibers being present in said predetermined portions at a concentration (C %) ranging between about 0.05% to about 0.5% volume, with a major part of the individual fibers in said predetermined portions having a D/L ratio which varies from about 0.0005 to about 0.008 so that in said predetermined portions the resistance of the plate or sheet is less than about 3.1 ohm-cm wherein the conductive fibers have a specific conductivity of at least 0.5% of the copper standard.

20. A plastic article in the form of a plate or sheet according to any one of claims 1, 16 or 19 wherein the article exhibits a shielding effectiveness (SE) against electromagnetic radiation of at least about 25 dB.

21. A plastic article according to claim 20, wherein the shielding effectiveness occurs at a frequency of about 1 GHz.

22. A plastic article according to claim 20, wherein the shielding effectiveness occurs over a frequency range of about 0.4 GHz to about 5 GHz.

23. A process for forming plastic articles having at least predetermined electrically conductive portions therein including the steps of admixing a predetermined volume of substantially pure plastic material with another predetermined volume of fiber/plastic composite granules, said granules being comprised of at least a plastic material with a relatively low molecular weight which is compatible with said pure plastic material and conductive fibers, embedded in the low molecular weight material, having a substantially parallel fiber arrangement within the granule, said granule being sheathed with an additional plastic material and having between 1000 and 35000 conductive fibers in a bundled arrangement with a fiber diameter of less than about 0.015 mm, heating the admixture and working the heated admixture while maintaining a low shear conditions to avoid excessive breakage of the fibers, but with sufficient shear to substantially evenly disperse the fibers within the heated admixture, forwarding the hot worked admixture through at least one orifice and forming it to a certain shape and cooling the thus shaped admixture.

24. A process according to claim 23, wherein the pure plastic material of step (a) is comprised of plastic pellets.

25. A process according to claim 23 including the further step of forming the article by injection molding the worked mixture.

26. A process as set forth in claim 23, wherein the volume concentration (C%) of said conductive fibers in said conductive portions is between about 0.05 and about 0.5%.

27. A process as set forth in claim 23, wherein the volume concentration (C%) of said conductive fibers in said conductive portions ranges from about 0.5% to about 1.0%.

28. The process of claim 23 wherein the granule has a flattened cross-sectional surface.

29. The process of claim 23 wherein the length of the granule ranges from about 0.4 cm to 1.5 cm.

30. The process of claim 23, wherein the fiber content in said bundle is between about 30% and about 70% of the volume of the granule.

31. The process of claim 23 further including other fibers in the bundled arrangement.

32. A process according to claim 23, wherein the worked mixture is extruded in thread shape form with a dispersed conductive fiber content ranging between about 0.5% vol. and about 2% vol.

33. A process as in claim 32 including the further step of chopping the extruded thread into grains having a length from about 0.4 cm to about 1.2 cm.

34. A process according to claim 33 including the further steps of admixing the grains with a predetermined volume of substantially pure plastic material so as to provide a mixture wherein from about 0.05% to about 0.5% vol. of fibers are substantially evenly distributed, and forming the worked mixture into a plastic article wherein the D/L ratio varies from about 0.0005 to 0.008 for a major part of the fibers.

35. A process as in claim 34 wherein the plastic in the grains has a softening and melting point, respectively, at most equal to that of the plastic material with which they are admixed.

36. A process as in claim 34 wherein the article is formed by extrusion through a die.

37. A process as in claim 34 wherein the article is formed by injection molding.

38. A process according to claim 23 including the further step of forming the article by extrusion through a die.

39. A process according to claim 38 wherein the admixture is extruded to a thread with a conductive fiber content between about 0.5% volume and about 2% volume.

40. A process according to claim 32 or 39 including the further step of chopping the extruded thread into grains having a length from about 0.4 cm to about 1.2 cm.

41. A process for forming plastic articles having at least predetermined conductive portions including the steps of
  (a) admixing the grains obtained according to the process of claim 40 with a predetermined volume of substantially pure plastic material;
  (b) heating and working the plastic admixture to provide a random dispersion of the fibers at least within the predetermined conductive portions and
  (c) forwarding the hot worked admixture through at least one orifice in view of forming it to a certain shape and
  (d) cooling the thus shaped admixture.

42. A process according to claim 34 or 41 wherein the pure plastic material is comprised of plastic pellets.

43. The process of claim 41 wherein the process includes the additional step of dry mixing the pellets and the grains prior to step (b).

44. A process for forming a plastic article having at least predetermined conductive portions including the steps of
  (a) heating and working the grains obtained by the process of claim 33 to provide a substantially even distribution of the fibers in the worked plastic and
  (b) forwarding the hot worked plastic through at least one orifice in view of forming it to a certain shape and
  (c) cooling the thus shaped plastic.

45. A process according to claim 41 or 44 whereby the heated plastic is worked while maintaining low shear conditions to avoid excessive breakage of the fibers, but with sufficient shear to substantially evenly distribute the fibers within the admixture.

46. A process according to claim 41 or 44 wherein the article is formed by injection molding.

47. A process according to claim 41 or 44 wherein the article is formed by extrusion.

48. A process for forming plastic articles having at least predetermined electrically conductive portions therein including the steps of
  admixing a predetermined volume of substantially pure plastic material with another predetermined volume of fiber/plastic composite granules, said granules, being comprised of at least a plastic material with a relatively low molecular weight which is compatible with said pure plastic material and conductive fibers having a substantially parallel fiber arrangement within the granule,
  heating the admixture and working the heated admixture while maintaining low shear conditions to avoid excessive breakage of the fibers, but with sufficient shear to substantially evenly disperse the fibers within the heated admixture,
  forwarding the hot worked admixture through at least one orifice and forming it to a certain shape with a conductive fiber content between about 0.5% volume and about 2% volume, cooling the thus shaped mixture and the further step of chopping the extruded shape into grains having a length from about 0.4 centimeters to about 1.2 centimeters.

49. The process as in claim 48 wherein the certain shape is that of a thread.

* * * * *